(12) United States Patent
Newkome et al.

(10) Patent No.: US 9,059,409 B2
(45) Date of Patent: Jun. 16, 2015

(54) DENDRON-TETHERED AND TEMPLATED QUANTUM DOTS ON CARBON NANOTUBES

(75) Inventors: George R. Newkome, Medina, OH (US); Charles N. Moorefield, Akron, OH (US)

(73) Assignee: The University of Akron, Akron, OH (US)

(*) Notice: Subject to any disclaimer, the term of this patent is extended or adjusted under 35 U.S.C. 154(b) by 1337 days.

(21) Appl. No.: 12/301,255

(22) PCT Filed: May 23, 2007

(86) PCT No.: PCT/US2007/069507
§ 371 (c)(1),
(2), (4) Date: Nov. 18, 2008

(87) PCT Pub. No.: WO2008/060697
PCT Pub. Date: May 22, 2008

(65) Prior Publication Data
US 2010/0133471 A1    Jun. 3, 2010

Related U.S. Application Data

(60) Provisional application No. 60/803,009, filed on May 23, 2006.

(51) Int. Cl.
*H01L 51/00* (2006.01)
*B82Y 15/00* (2011.01)
*B82Y 30/00* (2011.01)
(Continued)

(52) U.S. Cl.
CPC .......... *H01L 51/0049* (2013.01); *C09K 11/565* (2013.01); *C09K 11/574* (2013.01); *B82Y 10/00* (2013.01); *B82Y 30/00* (2013.01);
(Continued)

(58) Field of Classification Search
CPC   H01L 51/0048; H01L 51/0095; B82Y 15/30; B82Y 30/00; C09K 11/88; C09K 11/881; C09K 11/883; C09K 11/885; C09K 11/56; C09K 11/562; C09K 11/565; C09K 11/567
USPC .............. 252/301.36; 977/748, 754, 913–826
See application file for complete search history.

(56) References Cited

U.S. PATENT DOCUMENTS 6,590,056 B2 * 7/2003 Won et al. ........................ 528/25
6,773,928 B1    8/2004 Yin et al.
(Continued)

OTHER PUBLICATIONS

Chaudhary. Fluorescence Microscopy Visulaization of Single-Walled Carbon Nanotubes Using Semiconductor Nanocrystals. Nano Letters. 2004 vol. 4, No. 12 2415-2419.*
(Continued)

*Primary Examiner* — Matthew E Hoban
(74) *Attorney, Agent, or Firm* — Renner, Kenner, Greive, Bobak, Taylor & Weber Co., L.P.A.

(57) ABSTRACT

The present invention provides an example for the construction of stable quantum dots, such as CdS quantum dots, on the surface of carbon nanotubes (CNTs) templated and stabilized, such as by attached 1→3 C-branched amide-based dendrons. The construction and method of preparation is applicable to both single- and multi-walled carbon nanotubes, other types of appropriately modified polymeric and oligomeric materials, along with the use of many other types of dendrons, and other materials capable of forming quantum dots.

14 Claims, 8 Drawing Sheets

(51) Int. Cl.
*C09K 11/57* (2006.01)
*B82Y 10/00* (2011.01)
*C09K 11/56* (2006.01)
*H01L 51/42* (2006.01)
*H01L 51/50* (2006.01)

(52) U.S. Cl.
CPC ............ *H01L51/0095* (2013.01); *H01L 51/42* (2013.01); *H01L 51/426* (2013.01); *H01L 51/50* (2013.01)

(56) References Cited

U.S. PATENT DOCUMENTS 7,226,953 B1 * 6/2007 Petruska et al. ................ 516/98

2001/0000889 A1 5/2001 Yadav et al.
2004/0253624 A1 12/2004 Smith et al.
2006/0024503 A1 2/2006 Wong et al.

OTHER PUBLICATIONS

Wang. Stabilization of Inorganic Nanocrystals by Organic Dendrons. J. Am. Chem. Soc. vol. 124, No. 10 2002.*

Hernandez, C. et al., "Ge/Si Self-Assembled Quantum Dots Grown on Si(001) in an Industrial High-Pressure Chemical Vapor Deposition Reactor," Journal of Applied Physics, 86(2):1145-1148, Jul. 15, 1999.*

Banerje. Synthesis and Characterization of Carbon Nanotube—Nanocrystal Heterostructures. NANO LETTERS 2002 vol. 2, No. 3 195-200.*

* cited by examiner

1

DENDRON-TETHERED AND TEMPLATED QUANTUM DOTS ON CARBON NANOTUBES

STATEMENT REGARDING FEDERALLY SPONSORED RESEARCH OF DEVELOPMENT

This invention was made with government support under cooperative agreements awarded by the National Science Foundation (DMR-041780, INT-0405242), the Air Force Office of Scientific Research (F49620-02-1-0428,02). The government may have certain rights to the invention.

BACKGROUND OF THE INVENTION

Functionalization of single- and multi-walled carbon nanotubes (CNTs) has attracted increasing attention due to their outstanding structural, chemical, electrical, and thermal properties. Methods developed for functionalizing CNTs include the formation of non-covalent as well as covalent assemblies. Among these, the modification of CNTs with metal nanoparticles can provide unique properties leading to advanced catalytic systems, very sensitive electrochemical sensors, and highly efficient fuel cells. Up to now, only a few protocols have been devised for attaching metal particles onto CNTs; these have included chemical binding through DNA double-helix linkages, electrochemical deposition, electroless deposition with and without the aid of reducing agents, and physical/chemical deposition on CNTs with and without surface activation.

Quantum dots provide a functional platform for the creation of novel materials and devices that benefit from the unique physical properties arising from their quantum-confined nature and properties, which are intermediate between those of the molecular and bulk size scales. They have also formed the basis for new photovoltaic cells, light-emitting diodes, bio-sensors, and other hybrid materials prepared by directed- and self-assembly techniques. These semiconducting nanoparticles have photophysical properties that are superior to many organic-based materials, and the use of dendrimers as nanoreactors, stabilizers and templates for their preparation presents advantages, such as temperature and size control.

SUMMARY OF THE INVENTION

The present invention provides an example for the construction of stable quantum dots, such as CdS quantum dots, on the surface of carbon nanotubes (CNTs) templated and stabilized, such as by attached 1→3 C-branched amide-based dendrons. The construction and method of preparation is applicable to both single- and multi-walled carbon nanotubes, other types of appropriately modified polymeric and oligomeric materials, along with the use of many other types of dendrons, and other materials capable of forming quantum dots.

BRIEF DESCRIPTION OF THE DRAWINGS

With reference to the figures, an example of the invention and characteristics thereof will be described, relating to an example of formed stable quantum dots in association with carbon nanotube structures. As shown in FIG. 1, a carbon nanotube 10, such as a single walled nanotube, is functionalized to form a quantum dot, such as a CdS quantum dot, on the carbon nanotube structure 10. Functionalizing the carbon nanotube 10 in this manner provides in an example, a semiconducting nanoparticle with photo physical properties which may be useful in photo valtaics, light-emitting structures, bio-sensors, catalytic systems, electro-chemical sensors or other unique materials or devices. With reference to FIG. 2, a particular example of a CdS quantum dot formed on the surface of a carbon nanotube is provided, wherein the functionalization of the carbon nanotube is achieved using dendron structures. As seen in FIG. 2, the synthesis of a tethered and untethered quantum dot is shown. In this example, a $3^{rd}$-generation 1→3 C-branched, amino-polyester dendron 20 was prepared by following a known procedure with starting material 15, with reagents and conditions at (i): Raney Ni, EtOH, $H_2$ (65 psi), 50° C., 24 h. Its structure was confirmed ($^{13}C$ NMR) by the presence of a quaternary carbon peak at 52.3 ppm ($R_3CNH_2$) and the molecular ion peak (MALDI-TOF MS) at m/z 4537.3 ([M+Na]$^+$ calc. m/z=4535.8). With reference to the preparation of CdS quantum dot with {[(HO$_2$C)$_{27}$-Den]-cellulose} may be similar to that of the dendrimer-encapsulated nanoparticles as described in the co-pending application of Applicant, PCT Application No. PCT/US07/69504 entitled: Construction of Quantum Dots via a Regioselective Dendritic Functionalized Cellulose Template, filed on an even date herewith and hereby incorporated by reference herein.

FIG. 2 illustrates an example of the basic strategy for the preparation of the dendron-tethered and templated CdS quantum dots on SWNTs. Treatment of commercial, oxidized SWNTs 10 [(HO$_2$C)$_n$-SWNT]s with excess SOCl$_2$ under anhydrous conditions gave [(ClOC)$_n$-SWNT]s at 22, with reagent and conditions (ii): SOCl$_2$, THF, 0° C. Thereafter, the modified SWNT's at 22 were then treated with the amino-polyester dendron 20 in the presence of Et$_3$N in dry CH$_2$Cl$_2$ to afford [(Den)$_n$-SWNT] at 24 with reagents and conditions (iii): G3-amino-dendron 20, Et$_3$N, CR$_2$Cl$_2$. Cleavage of the ester groups using formic acid at 25° C. at (iv) gave provided carboxylic acid-coated dendronized SWNTs {[(HO$_2$C)$_{27}$-Den]$_n$-SWNT} 24, which were then treated with alternating dropwise addition of Cd(NO$_3$)$_2$ and Na$_2$S at (v), both in methanol at 0° C. to generate the encapsulated CdS quantum dots 26, which may be tethered to the SWNT surface. Filtration, followed by repeated washing with MeOH, H$_2$O, and acetone, gave the nanoparticles free of bulk reagents and surface attached ions. TGA analysis of the initial [(HO$_2$C)$_n$-SWNTs] 10 showed excellent thermal stability below 600° C. under a nitrogen atmosphere (FIG. 3 at 25); whereas, dendronized SWNT 24 exhibited a weight loss at >ca. 200° C. (FIG. 3 at 27) that is well-known to be associated with tertbutyl esters, which undergo a quantitative thermal loss of isobutylene. A TGA thermogram of pure G3-amino-dendron 20 is shown at 29 in FIG. 3. The degradation of the dendronized SWNT 24 also provided a facile way to ascertain the presence of the dendron on the SWNT's surface and an estimated percentage (ca. 15%) of its overall composition.

As shown in FIG. 4, UV absorbance behavior for the CdS/Den-SWNT hybrid 26 is shown at 30 and compared with the UV absorbance behavior for the $[(HO_2C)_n$-SWNT] at 32 CdS/dendron hybrid 26 not tethered to the SWNT surface at 34; after 90 days of CdS/Den-SWNT hybrid 26 tethered to the SWNT surface at 36. As seen, the CdS/Den-SWNT hybrid 26 revealed significant absorption of UV light at 273 nm (calculated by using the Lorentzian multi-peak analysis method) with a 242 nm blue-shift when compared with the characteristic absorption of the corresponding band-gap of bulk CdS (515 nm). This indicates the quantum confinement effect of the CdS nanocrystal, produced under this environment, corresponding to the first optically allowed transition between the electron state in the conduction band and the hole state in the valence band. For comparison, the $[(HO_2C)_n$-SWNTs], which were analogously treated with $Cd^{2+}$ and $S^{2-}$ solutions and followed by copious washing, does not exhibit any absorption at the same wavelength indicating that there is no CdS nanoparticles tethered to the SWNT surfaces.

Figure 1:
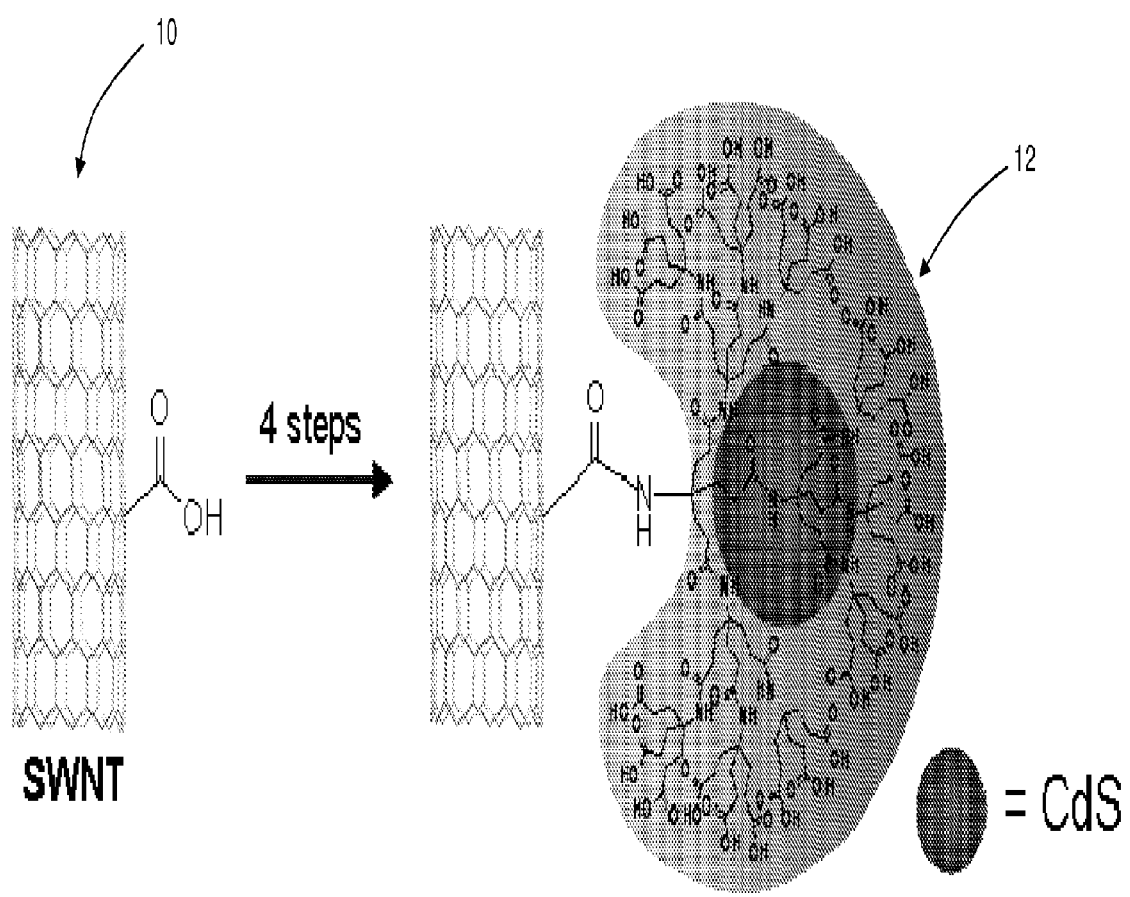
FIG. 1 shows an example of dendronization of a carbon nanotube according to an example of the invention.
Figure 2:
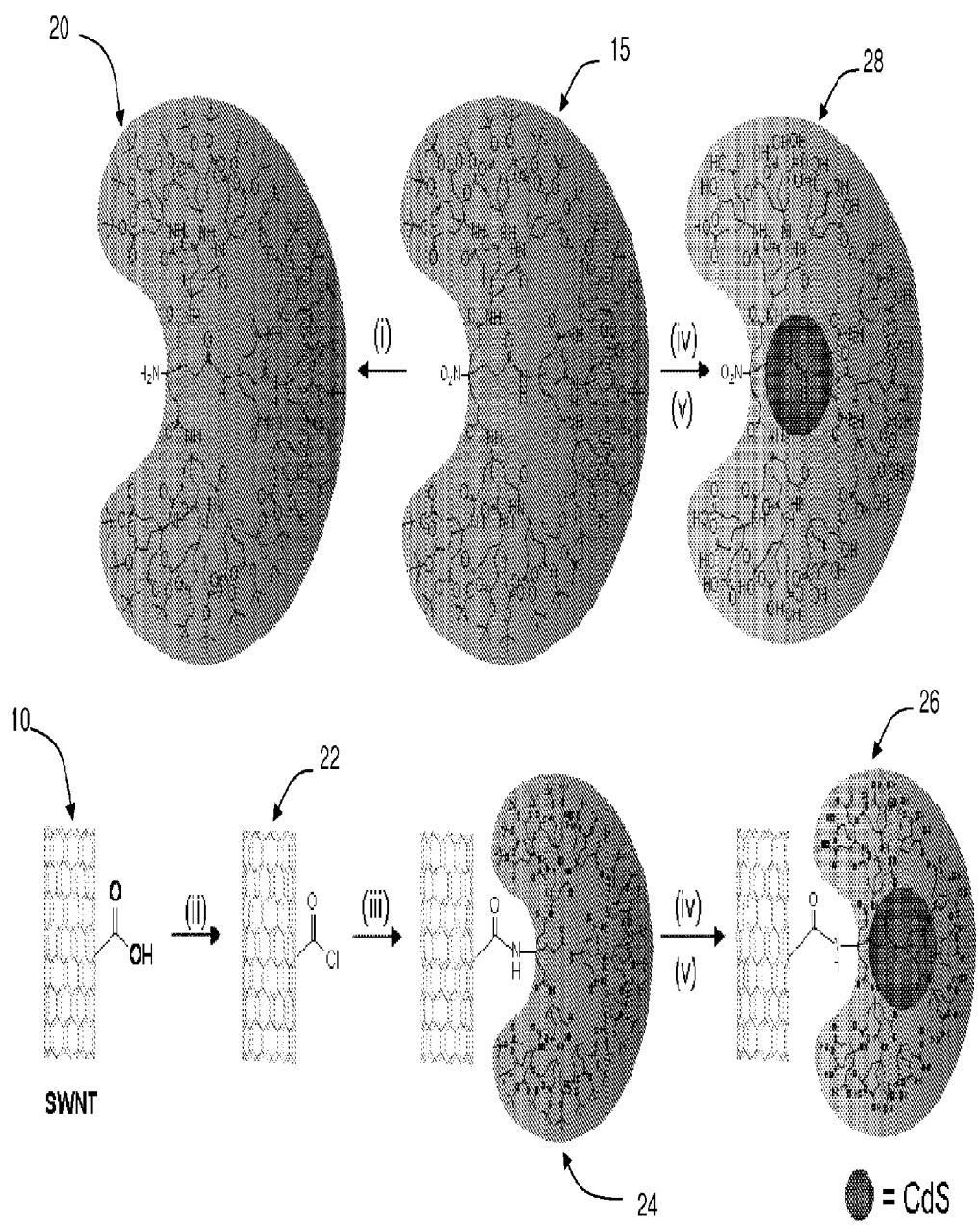
FIG. 2 shows an example of preparation of the dendron-tethered quantum dots on carbon nanotubes according to an example of the invention.
Figure 3:
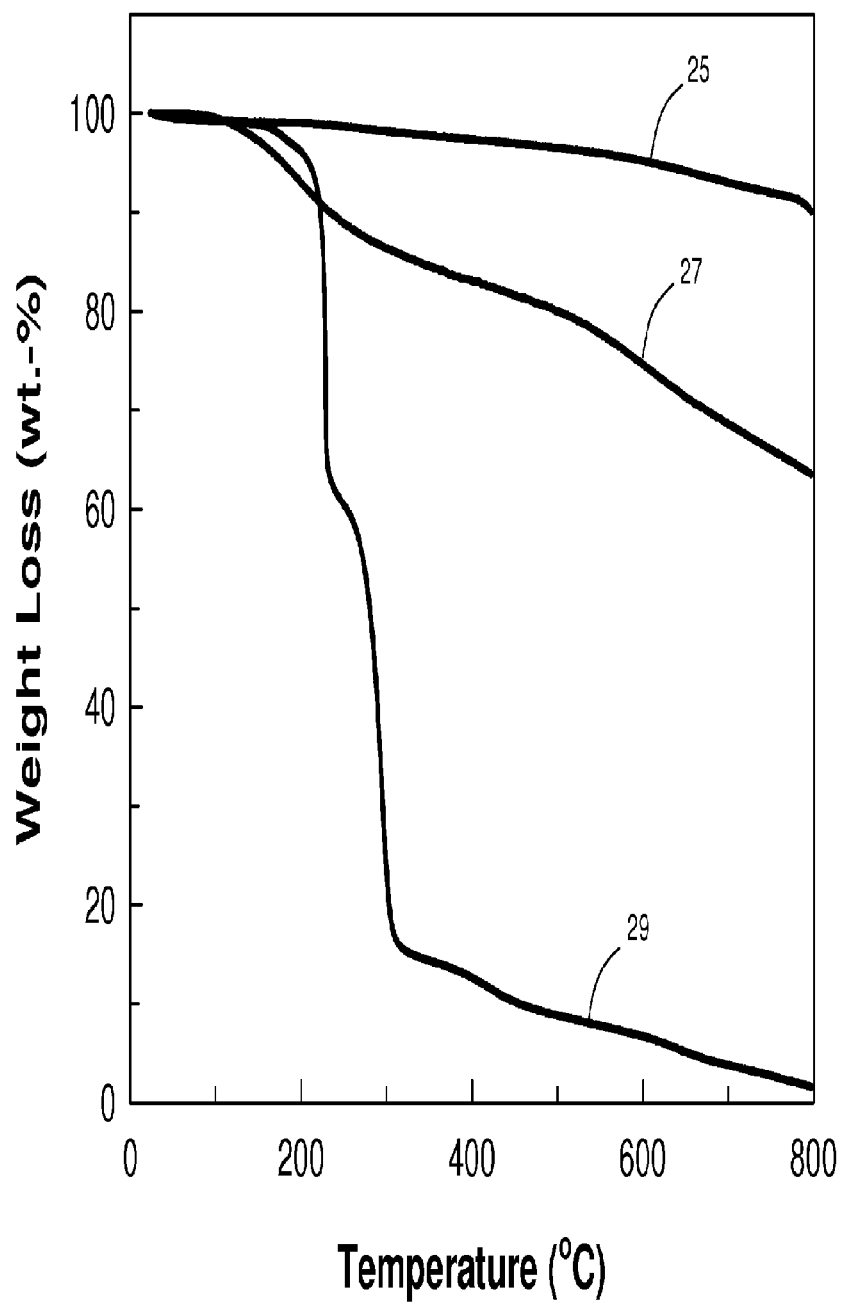
FIG. 3 shows TGA analysis of the initial carbon nanotube material and dendron along with the dendronized carbon nanotubes materials according to an example of the invention.

Since particle size is directly related to the absorption wavelength of quantum-sized particles due to a size quantization effect, the diameter of the CdS particles was predicted to be ca. 1.4 nm from their optical absorbance spectrum. These results agree well with measurements based on molecular modeling of the fully expanded dendron (ca. 1.9 nm; focal point to periphery distance). While, the absorption peak of the CdS/dendron hybrid 28 (see FIG. 2) at 34 in FIG. 4 occurred at somewhat higher wavelength than that of CdS/Den-SWNT hybrid 26. This red shift of the absorption indicated that CdS/dendron hybrid 28 contains larger CdS nanoparticles than that of the CdS/Den-SWNT hybrid 26. UV absorption peak of CdS/Den-SWNT hybrid 26 appeared at nearly the same wavelength (~272 nm) as indicated at 36, even after 90 days. Thus, the SWNT surface-anchored dendrons stabilize the CdS nanoparticles against coalescence into bulk CdS particles by their mutual van der Waals attraction.

Figure 5:
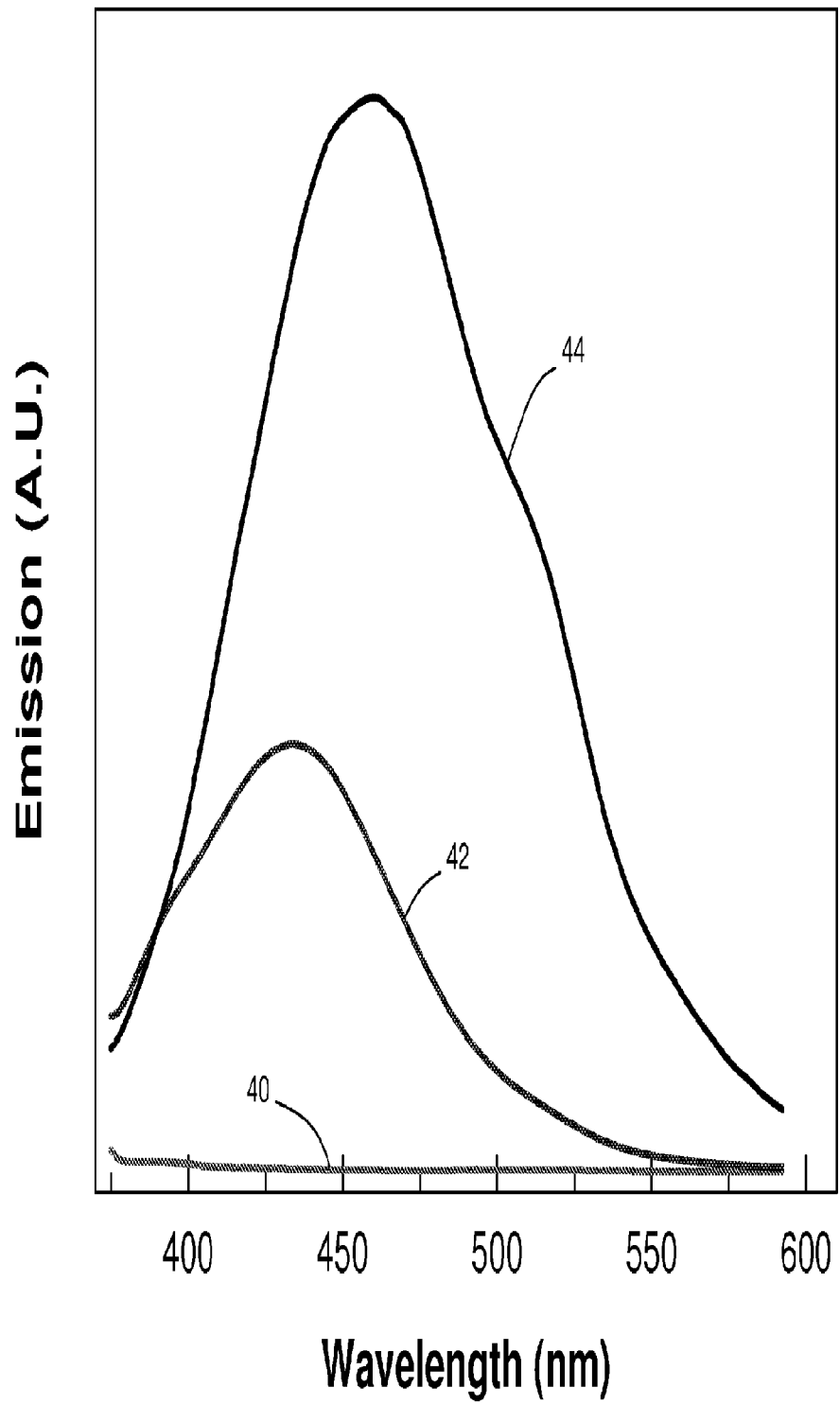
FIG. 5 shows photoluminescence spectrum for the constituent materials and dendronized carbon nanotube construction according to this example of the invention.

As seen in FIG. 5, there is shown photoluminescence spectrum for $[(HO_2C)_n$-SWNT] 10 at 40, the; CdS/Den-SWNT hybrid 26 at 42, and the CdS/dendron hybrid 28 at 44] Upon light excitation at 350 nm, the CdS/Den-SWNT hybrid 26 exhibits photoluminescence with a maximum emission at 434 nm as indicated by curve 42, which is assigned to an electron-hole recombination in the CdS nanoparticles and is further indicative of the quantum size effect. There was no observable luminescence peak in the case of $[(HO_2C)_n$-SWNT] after treatment with $Cd^{2+}$ and $S^{2-}$ solutions as shown by curve 40. It appears therefore that the luminescence of CdS quantum dots, attached directly to the SWNTs, is totally quenched by the charge-transfer mechanism that occurs between the CdS quantum dots and the SWNTs. In contrast, CdS/Den-SWNT hybrid 26 (FIG. 2) showed a significant luminescence, but a decreased emission intensity when compared to that of CdS/dendron hybrid 28 as indicated by curve 44. A possible origin for this phenomenon is based on the known properties of SWNT and quantum dots. In the hybrid system (i.e., 26) of SWNT and quantum dots, electron-hole recombination competes with the electron-injection mechanism, and this competition should depend on the distance between the quantum dot and the SWNT. Thus, the electrons of the excitons could be partially transferred to SWNTs by an electron-injection mechanism while the remainder of electrons provides for a reduced emission by an electron-hole recombination process.

Figure 6:
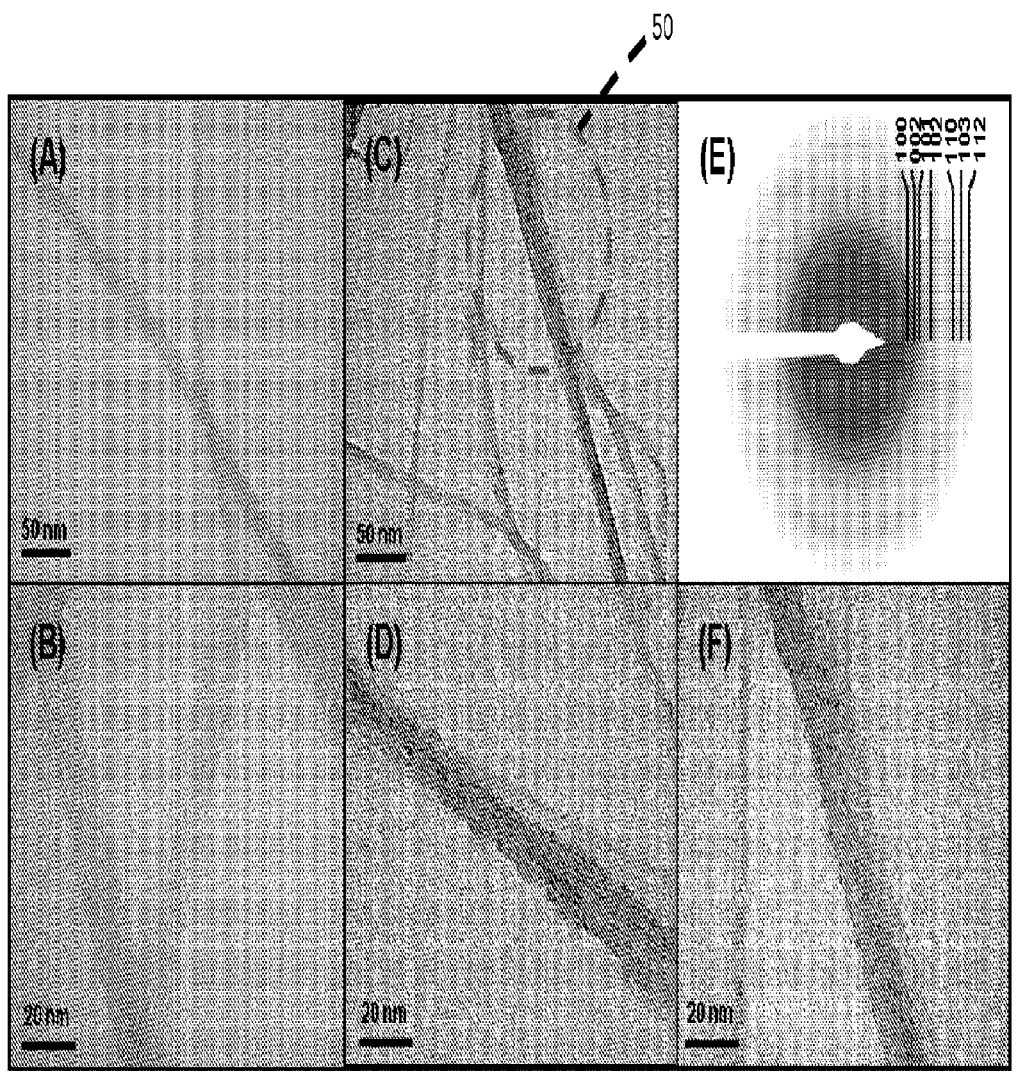
FIG. 6 shows transmission electron microscope images of structures formed according to an example of the invention.

FIG. 6 shows transmission electron microscope (TEM) images of carboxylic acid-coated dendronized SWNT with/without the CdS nanoparticles. It can be seen that the quantum dots [black spots in FIGS. 6 (C), (D), and (F)] are well-dispersed and attached to the SWNTs. FIG. 6(E) shows a corresponding selected area electron diffraction (SAED) pattern for the CdS/Den-SWNT hybrid 26. Calibration of the SAED spacing was conducted using standard evaporated thallous chloride, which has the largest first-order spacing diffraction of 0.384 nm. In FIG. 6(E) shows the electron diffraction pattern for the selected area 50 shown in FIG. 6C, wherein several diffused diffraction rings appeared with five different d-spacings: 0.358, 0.336, 0.245, 0.207 and 0.176 nm, which belong to the (100), (002), (102), (110) and (112) Miller indices of CdS wurtzite, respectively. The electron diffraction pattern of the CdS at (101) and (103) is weak, but support the fact that the black spots of 26 are randomly oriented, small CdS crystals.

Figure 7:
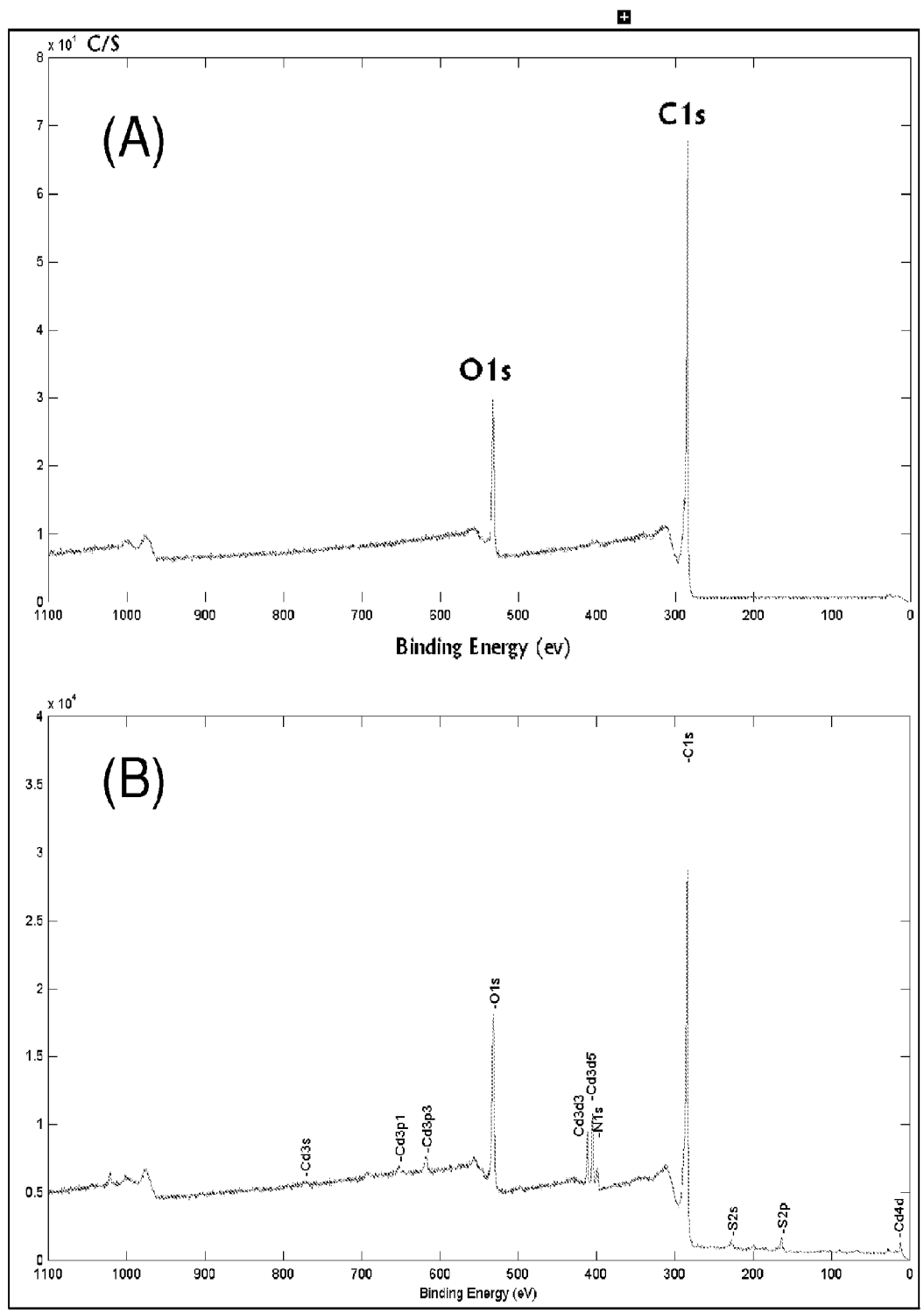
FIG. 7 shows XPS spectra for structures formed according to an example of the invention.

Turning to FIG. 7, FIG. 7A shows X-ray photoelectron spectroscopic (XPS, monochromatic Mg Kα radiation at a power of 250 W, 93.90 eV) measurements for pure $[(HO_2C)_n$-SWNT] and FIG. 7 (B) shows measurements for the CdS/Den-SWNT hybrid 26]. Upon light excitation the CdS/Den-SWNT hybrid 26, it is noted that new peaks attributed to N1s at 398 eV along with other expected peaks assigned to Cd (3d5 at 405.0 eV and 3d3 at 412.1 eV) and S (2s at 229.4 eV and 2p at 165.3 eV) [FIG. 7 (B)]. The binding energies were calibrated for a backbone carbon peak at 284.8 eV. The small shift of the Cd peak (from 405.5 eV to 405.0 eV) is in full agreement with the formation of CdS particles.

Figure 8:
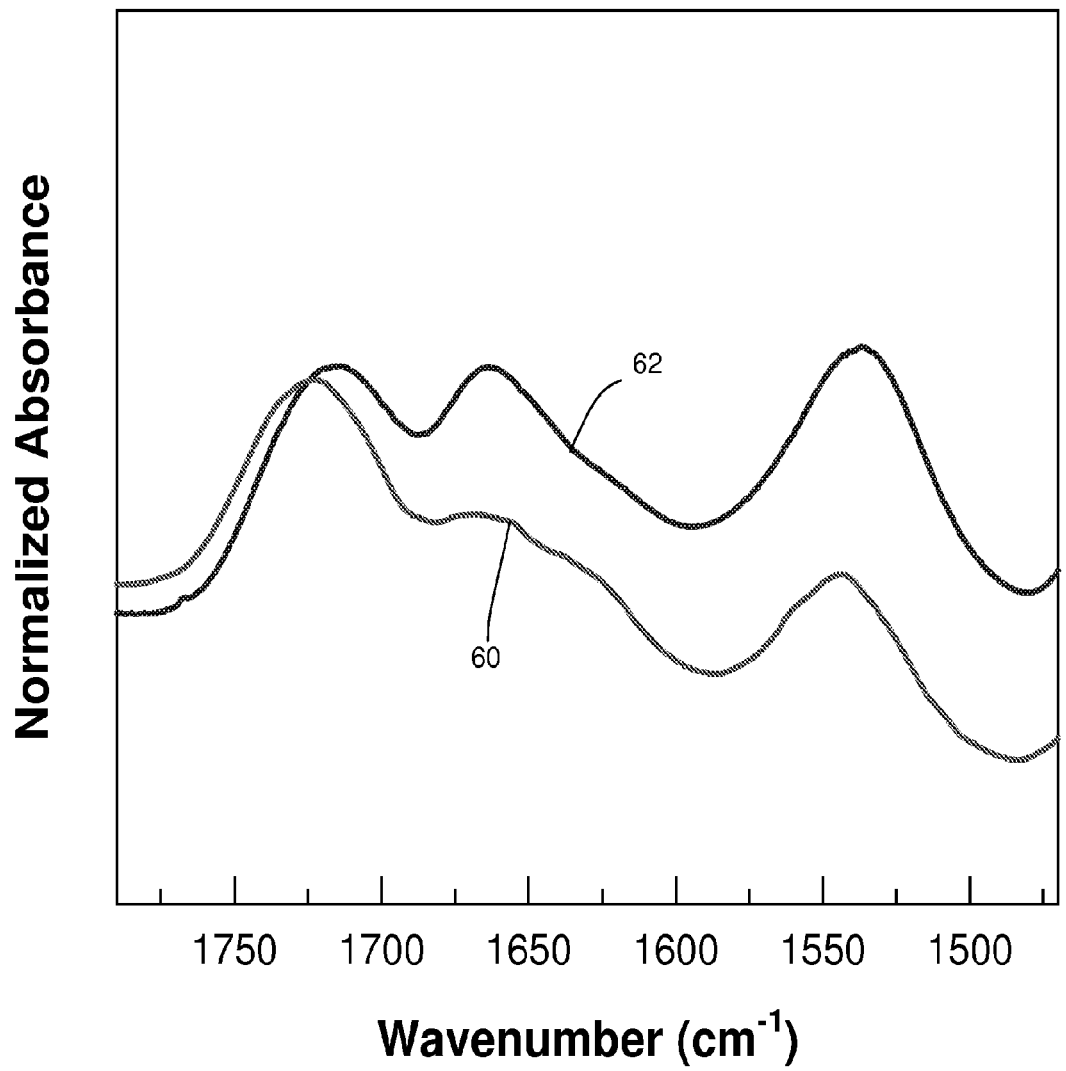
FIG. 8 shows FT-IR spectra for structures formed according to an example of the invention.

The un-ionized and uncoordinated carboxylic acid C=O stretching band appears at 1750~1700 $cm^{-1}$; whereas, the ionized C=O stretching band occurs at 1650~1590 $cm^{-1}$. As shown in FIG. 8, there is shown [FT-IR spectra for the pure acid-terminated dendron at 60 and CdS/dendron hybrid 28]. The IR spectrum of carboxylic acid-coated dendron showed a strong asymmetric vibration characteristic of carboxyl groups at 1715 $cm^{-1}$ and weak broad peak at 1660 $cm^{-1}$ attributed to hydrogen bonding between carboxyl groups in the film state. The IR spectrum of CdS/dendron hybrid 28 exhibited an ionized carbonyl frequency at the usual position near 1660 $cm^{-1}$ with an increased intensity. The intensity of the asymmetric carboxylate stretching vibration band at ~1540 $cm^{-1}$ attributed to complexed carboxylates with metal ions or CdS clusters also increased.

Figure 4:
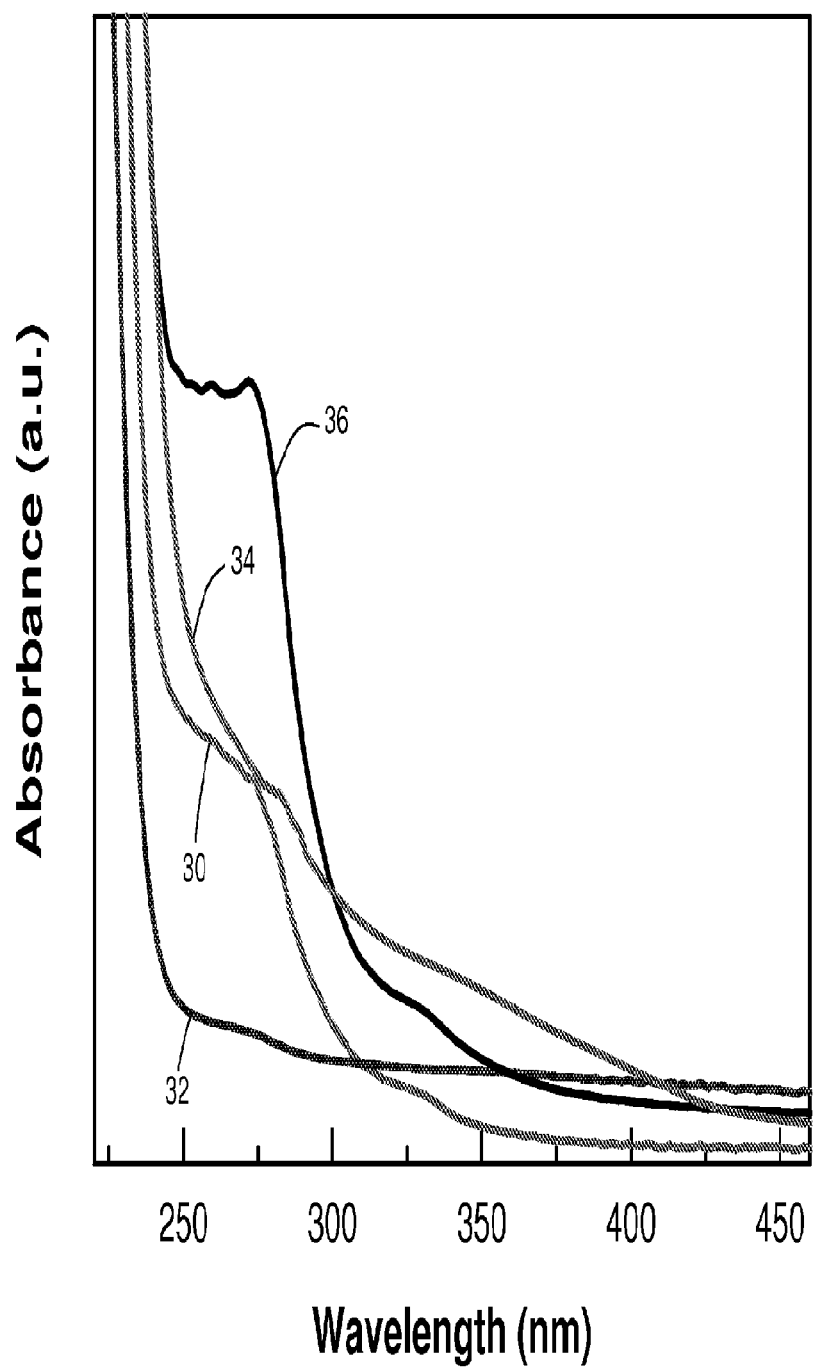
FIG. 4 shows UV absorbance behavior for the dendronized carbon nanotube construction as set forth in this example of the invention.

Comparison of the UV/Vis spectra gives insight into the cluster size-distribution differences. In an otherwise ideal local environment, the position of the observed dispersion peak for the nanoparticles is a function of both domain size and aspect ratio. Consequently, one would expect a single distribution curve in the electromagnetic spectrum for a homogenous nanoparticle and a multimodal distribution curve (broader and much less defined) for heterogeneous nanoparticles. Thus, from the broad UV/Vis spectra and IR band at ~1540 $cm^{-1}$ for the CdS/dendron hybrid 28, we speculated that CdS clusters were produced in the void regions of single and aggregated dendrons; this is in agreement with other dendrimer composites. In contrast, the CdS/Den-SWNT hybrid 26 exhibited a more narrow single distribution curve (as shown in FIG. 4) suggesting that these CdS nanoparticles were produced in the void region of the dendrons tethered to SWNT's surface.

From this example of CdS quantum dot composite assemblies using dendronized SWNTs. It should be evident that the methods according to the invention are applicable to both single- and multi-walled carbon nanotubes, other types of appropriately modified polymeric and oligomeric materials, as well as the use of many other types of dendrons and other materials capable of forming quantum dots. Accordingly, any material suitable for forming quantum dots, which may be characterized as semiconductive nanocrystals typically between 1 and 10 nanometers in diameter, may be provided to have unique properties between that of single molecules and bulk materials. Quantum dots offer tunable optical and electronic properties that can work around natural limits inherent in traditional semiconductors. In one aspect of the invention, the quantum dots have a composition that may include cadmium sulfide, cadmium selenide, silicon germanium or mixtures thereof. Other suitable materials are also contemplated. Further, the quantum dots may have a heavy metal-free composition, such as including indium gallium phosphide. In accordance with the invention, the quantum dots may be produced and constructed on the surface of a substrate while remaining uncoated. For example, the quantum dots may not have any core shell coating, of example zinc sulfide, which are typically required in past quantum dot systems. Further, although the example of the invention as described previously with respect to CdS quantum dots in association with a particular dendron structure, it should be noted that other dendron structures are contemplated, such as at least a third generation, and up to a fifth generation dendron for example, which can be porphyrin-based, polyester-based, amino-polyester based, pyridene-based, amide-based or mixtures thereof. The dendron is also capable of being hydrophilic, hydrophobic or mixtures thereof, such as including a hydrophilic outer portion wherein the end groups of the dendron are hydrophilic, and a hydrophobic inner portion, wherein the core of the dendron is hydrophobic, or other similar examples. In the example described, and other contemplated examples, resulting nanohybrids may be characterized by UV/Vis, XPS, TEM, and SAED; and the size of these materials appears to be in the quantum-confined regime and they exhibit novel luminescence properties. In the described example, the templated CdS quantum dots also show long-term stability (>90 days) at ambient temperatures, which would also be expected with other examples. These features suggest that these and other quantum dot assemblies with $\{[(HO_2C)_{27}\text{-Den}]_n\text{-SWNT}\}$ may be useful for fabricating molecular electronic devices predicated on their unique nanoscale electronic properties.

Experimental Information

Chemicals were purchased and used without further purification. Thin layer chromatography (TLC) was conducted on flexible sheets precoated with $SiO_2$ (1B2-F). Column chromatography used $SiO_2$ (60-200 mesh). The melting points were determined on Electrothermal 9100 heater. $^1H$ and $^{13}C$ NMR spectra were recorded on a 300 MHz NMR. spectrometer using $CDCl_3$. Mass spectra were obtained by Matrix-Assisted Laser Desorption Ionization Time-of-Flight (MALDI-TOF) using trans-3-indoleacrylic acid (IAA), as the matrix. UV/Vis absorption spectra were obtained on Hewlett-Packard UV/Vis spectrophotometer. Photoluminescence spectra were obtained using a Perkin-Elmer LS55 luminescence spectrometer. Digilab Win-IR Pro FTS 3000 Fourier transform infrared spectrometer (FT-IR) was used on film samples prepared via film-casting from solution onto the KBr plates. TEM images were obtained by using scanning transmission electron microscopy at an acceleration voltage of 120 kV. TEM samples were prepared by casting a MeOH suspension on carbon-coated mica surface. After 12 h, the films were removed from the glass slide, floated on water surface and recovered using copper grids. Thermogravimetric analysis (TGA) was conducted with a DuPont model 2950 at a heating rate of 10° C./min under a nitrogen atmosphere. X-ray photoelectron spectroscopy (XPS) was performed using Perkin-Elmer PHI-5600 system with a Mg anode (Mg $K\alpha$=93.90 eV) operating at 250 W and a 50 cm hemispherical electron energy analyzer.

Synthesis of $3^{rd}$ Generation Dendron

This dendron possessing amino focal site was obtained (73%) from the nitro dendron 1 using T-1 Raney Ni catalyst, described the prior art: m.p. 105-106° C.; $^1H$ NMR δ 6.14 (s, 12H), 2.00 (br m, 78H), 1.77 (br m, 78H), 1.22 (s, 243H); $^{13}C$ NMR δ 27.6, 29.5, 31.3, 52.4, 57.0, 57.5, 80.1, 172.3, 172.9; MALDI-TOF MS: m/z 4537.4 $[M+Na]^+$ (Calcd. m/z=4535.8).

Synthesis of $3^{rd}$ Generation Carboxyl-Coated Dendron

A solution of $3^{rd}$ generation predendron (FIG. 2 at 15) [m.p. 161-162° C.; 100 mg, 22 μmol] in formic acid (7 mL) was stirred for 24 h at 25° C. After the reaction, the excess formic acid was removed in vacuo, $H_2O$ (10 mL) and acetone (50 mL) were added to dissolved the resulting oil. After concentration in vacuo, the $3^{rd}$ generation carboxyl-coated dendron 28 was isolated in nearly quantitative yield, as white solid: m.p. 134-136° C.; $^1H$ NMR ($CD_3OD$) δ 7.49 (s, 3H), 7.30 (s, 9H), 5.14 (br, s, 27H), 2.27 (br m, 78H), 2.02 (br m, 78H); $^{11}C$ NMR ($CD_3OD$) δ 177.4, 175.8, 58.9, 58.7, 32.0, 20.6, 29.4; MALDI-TOF MS: m/z 3064.3 [M+Na] (Calcd. m/z=3065.3).

Preparation of the Chlorocarbonyl-Functionalized SWNT $[(ClOC)_n\text{-SWNT}]$

Dry oxidized SWNT $[(HO_2C)_n\text{-SWNT}$; Aldrich #652490, 80 mg] was suspended $SOCl_2$ (5 mL) and stirred at 65° C. for 24 h. The solid was then separated by filtration, washed with anhydrous THF, then dried in vacuo at 25° C. for 6 h to give the chlorocarbonyl-functionalized SWNT $[(ClOC)_n\text{-SWNT}]$ (70 mg), which was used without further purification.

Preparation of Dendronized SWNT $\{[(HO_2C)_{27}\text{-Den}]_n\text{-SWNT}\}$. To a stirred suspension of $[(ClOC)_n\text{-SWNT}]$ (70 mg), anhydrous $CH_2Cl_2$ (10 mL), and dry $Et_3N$ (several drops), the $3^{rd}$ generation amino-dendron (200 mg) was added drop wise at 0° C. and then stirred at 25° C. for 48 h. The solid was filtered and washed several times with excess $H_2O$ and $CH_2Cl_2$. The crude product was dispersed in excess $CH_2Cl_2$, filtered, and washed again to remove any adsorbed unreacted dendron. The black solid was collected and dried in vacuo overnight at 40° C. to afford the dendronized SWNT $[(Den)_n\text{-SWNT}]$: 75 mg. The suspension of $[(Den)_n\text{-SWNT}]$ (75 mg) in formic acid (10 mL) was stirred for 24 h at 25° C., then the excess formic acid was removed in vacuo. In order to insure the total removal for residual traces of formic acid, $H_2O$ (25 mL) and acetone (25 mL) were added to suspend the $\{[(HO_2C)_{27}\text{-Den}]_n\text{-SWNT}\}$, followed by concentration in vacuo to give the $\{[(HO_2C)_{27}\text{-Den}]_n\text{SWNT}\}$.

Preparation of CdS Quantum Dots.

Stock solutions (2.0 mM) of Cd and $S^{2-}$ were freshly prepared by dissolving $Cd(NO_3)_2 \cdot 4H_2O$ (12.4 mg) in MeOH (20 mL) and dissolving $Na_2S$ (3.0 mg) in MeOH (20 mL), respectively. In the incremental addition procedure, a 0.5 mL aliquot of $Cd^{2+}$ methanolic solution was added to 10 mL of either a $\{[(HO_2C)_{27}\text{-Den}]_n\text{-SWNT}\}$ (60 mg) or $[(HO_2C)_n\text{-SWNT}]$ (50 mg) methanolic suspension at 0° C., then sonicated, followed by addition of a 0.5 mL aliquot of $S^{2-}$ methanolic solution. This procedure was repeated several times. After complete addition of $Cd^{2+}$ and $S^{2-}$ stock solutions, the suspension was kept at 0° C. overnight, then filtrated and washed sequentially with MeOH, $H_2O$, and acetone.

Preparation of CdS Quantum Dots with the carboxyl-coated dendron 28 followed an analogous manner, as describing above, without further filtration and washing steps.

What is claimed is:

1. A functionalized carbon nanotube comprising:
   a carbon nanotube having an interior surface and an exterior surface;
   at least one dendron tethered to a portion of the exterior surface of the carbon nanotube; and
   at least one semiconductive nanocrystal embedded in the at least one dendron,
   wherein the at least one dendron is tethered to the portion of the exterior surface of the carbon nanotube by way of an assembly, where the assembly is covalently bonded to both the exterior surface of the carbon nanotube and the at least one dendron.

2. The functionalized carbon nanotube of claim 1, wherein the at least one semiconductive nanocrystal is a quantum dot.

3. The functionalized carbon nanotube of claim 2, wherein the quantum dot is uncoated.

4. The functionalized carbon nanotube of claim 2, wherein the quantum dot comprises cadmium sulfide.

5. The functionalized carbon nanotube of claim 2, wherein the quantum dot comprises cadmium selenide.

6. The functionalized carbon nanotube of claim 2, wherein the quantum dot comprises silicon germanium.

7. The functionalized carbon nanotube of claim 2, wherein the quantum dot comprises indium gallium phosphide.

8. The functionalized carbon nanotube of claim 1, wherein the carbon nanotube is a single wall carbon nanotube.

9. The functionalized carbon nanotube of claim 1, wherein the carbon nanotube is a multi-wall carbon nanotube.

10. The functionalized carbon nanotube of claim 1, wherein the dendron is at least a third generation dendron.

11. The functionalized carbon nanotube of claim 10, wherein the at least third generation dendron is acid terminated.

12. A functionalized substrate comprising:
    a substrate having an interior surface and an exterior surface;
    at least one dendron tethered to a portion of the exterior surface of the substrate; and
    at least one semiconductive nanocrystal embedded in the at least one dendron,
    wherein the at least one dendron is tethered to the portion of the exterior surface of the substrate by way of an assembly, where the assembly is covalently bonded to both the exterior surface of the substrate and the at least one dendron.

13. The substrate of claim 12, wherein the assembly is an amide group.

14. The functionalized carbon nanotube of claim 1, wherein the assembly is an amide group.

* * * * *